(12) United States Patent
Yamamoto

(10) Patent No.: US 11,408,915 B2
(45) Date of Patent: Aug. 9, 2022

(54) CYLINDRICAL BODY AND METHOD FOR PRODUCING SAME

(71) Applicant: NIDEC-READ CORPORATION, Kyoto (JP)

(72) Inventor: Masami Yamamoto, Kyoto (JP)

(73) Assignee: NIDEC READ CORPORATION, Kyoto (JP)

( * ) Notice: Subject to any disclaimer, the term of this patent is extended or adjusted under 35 U.S.C. 154(b) by 0 days.

(21) Appl. No.: 17/043,723

(22) PCT Filed: Apr. 10, 2019

(86) PCT No.: PCT/JP2019/015569
§ 371 (c)(1),
(2) Date: Sep. 30, 2020

(87) PCT Pub. No.: WO2019/208216
PCT Pub. Date: Oct. 13, 2019

(65) Prior Publication Data
US 2021/0035701 A1 Feb. 4, 2021

(30) Foreign Application Priority Data
Apr. 27, 2018 (JP) .............................. JP2018-086082

(51) Int. Cl.
| G01R 1/067 | (2006.01) |
|---|---|
| G01R 3/00 | (2006.01) |
| H01B 1/02 | (2006.01) |
| H01B 13/00 | (2006.01) |
| G01R 1/04 | (2006.01) |

(52) U.S. Cl.
CPC ......... *G01R 1/06722* (2013.01); *G01R 1/067* (2013.01); *G01R 1/06733* (2013.01); *G01R 1/06761* (2013.01); *G01R 3/00* (2013.01); *H01B 1/02* (2013.01); *H01B 13/00* (2013.01); *G01R 1/04* (2013.01); *G01R 1/0416* (2013.01)

(58) Field of Classification Search
None
See application file for complete search history.

(56) References Cited

U.S. PATENT DOCUMENTS

| 7,393,214 B2 | 7/2008 | DiStefano | |
|---|---|---|---|
| 7,491,069 B1 | 2/2009 | Di Stefano et al. | |
| 8,410,367 B2 | 4/2013 | Hirano et al. | |
| 9,109,294 B2 | 8/2015 | Kojima et al. | |
| 10,215,801 B2 | 2/2019 | Nasu | |
| 2007/0197099 A1* | 8/2007 | DiStefano | H01R 13/2407 439/620.1 |
| 2013/0057309 A1* | 3/2013 | Kojima | C25D 1/02 324/755.05 |
| 2014/0028343 A1* | 1/2014 | Numata | G01R 31/2801 324/763.01 |
| 2019/0383858 A1* | 12/2019 | Yamamoto | G01R 1/06755 |

FOREIGN PATENT DOCUMENTS

JP 2010257757 A 11/2010

\* cited by examiner

*Primary Examiner* — Katie L. Hammer
(74) *Attorney, Agent, or Firm* — Viering, Jentschura & Partner mbB

(57) ABSTRACT

A cylindrical body is formed of a conductive member provided with a spiral spring portion. Further, the cylindrical body includes a Ni metal layer and a Ni—W alloy layer containing W, and an end portion of the Ni—W alloy layer protrudes to an outer side of the Ni metal layer.

8 Claims, 13 Drawing Sheets

CYLINDRICAL BODY AND METHOD FOR PRODUCING SAME

CROSS-REFERENCE TO RELATED APPLICATIONS

This is the U.S. national stage of application No. PCT/JP2019/015569, filed on Apr. 10, 2019, and priority under 35 U.S.C. § 119(a) and 35 U.S.C. § 365(b) is claimed from Japanese Patent Application No. 2018-086082, filed on Apr. 27, 2018; the disclosures of which are incorporated herein by reference.

FIELD

Various embodiments relate to a cylindrical body that can be used for inspection of an inspection target, and a method for producing the same.

BACKGROUND

Conventionally, a contact terminal having a spiral spring portion is produced by forming a gold plating layer, a Ni electroformed layer, and a resist layer on the outer periphery of an ultrafine core wire, irradiating the resist layer with a laser beam in a spiral shape to remove the resist layer in the irradiated portion, performing etching to remove the Ni electroformed layer in a portion from which the resist layer has been removed, and then, removing the core wire.

When the contact terminal produced in this manner is used to inspect an inspection target, one end portion of the contact terminal is pressed against an electrode side and the other end portion of the contact terminal is biased toward the inspection target in response to a restoring force generated by elastic deformation of the spiral spring portion. As a result, electrical conduction is obtained.

Meanwhile, if a natural oxide film is formed on the electrode against which one end portion of the contact terminal configured as described above is pressed, the electrical conductivity is likely to decrease. For this reason, it is necessary to suppress the formation of the natural oxide film by plating the electrode with gold or to periodically remove the natural oxide film formed on the surface of the electrode.

SUMMARY

A cylindrical body according to an example of the present disclosure is a cylindrical body formed of a conductive member provided with a spiral spring portion. The cylindrical body includes a Ni metal layer and a Ni—W alloy layer containing W, and an end portion of the Ni—W alloy layer protrudes to an outer side of the Ni metal layer.

Further, a method for producing a cylindrical body according to an example of the present disclosure includes: a gold plating layer formation step of forming a gold plating layer on an outer peripheral surface of a core wire; a Ni metal layer formation step of forming a Ni metal layer on an outer peripheral surface of the gold plating layer; a Ni—W alloy layer formation step of forming a Ni—W alloy layer containing W on an outer peripheral surface of the Ni metal layer; a resist layer formation step of forming a resist layer on an outer peripheral surface of the Ni—W alloy layer; a spiral groove formation step of forming a spiral groove in the resist layer; a metal layer removal step of removing the Ni metal layer and the Ni—W alloy layer located in a formation portion of the spiral groove by etching using the resist layer as a masking material and eroding an end portion of the Ni metal layer such that an end portion of the Ni—W alloy layer protrudes to an outer side of the Ni metal layer depending on a difference in etching rate between the Ni metal layer and the Ni—W alloy layer; a resist layer removal step of removing the resist layer; a gold plating layer removal step of removing the gold plating layer located in the formation portion of the spiral groove; and a core wire drawing step of drawing the core wire.

Further, a method for producing a cylindrical body according to an example of the present disclosure includes: a gold plating layer formation step of forming a gold plating layer on an outer peripheral surface of a core wire; a Ni—W alloy layer formation step of forming a Ni—W alloy layer containing W on an outer peripheral surface of the gold plating layer; a Ni metal layer formation step of forming a Ni metal layer on an outer peripheral surface of the Ni—W alloy layer; a resist layer formation step of forming a resist layer on an outer peripheral surface of the Ni metal layer; a spiral groove formation step of forming a spiral groove in the resist layer; a metal layer removal step of removing the Ni metal layer and the Ni—W alloy layer located in a formation portion of the spiral groove by etching using the resist layer as a masking material and eroding an end portion of the Ni metal layer such that an end portion of the Ni—W alloy layer protrudes to an outer side of the Ni metal layer depending on a difference in etching rate between the Ni metal layer and the Ni—W alloy layer; a resist layer removal step of removing the resist layer; a gold plating layer removal step of removing the gold plating layer located in the formation portion of the spiral groove; and a core wire drawing step of drawing the core wire.

The above and other elements, features, steps, characteristics and advantages of the present disclosure will become more apparent from the following detailed description of the preferred embodiments with reference to the attached drawings.

DETAILED DESCRIPTION

Figure 1:
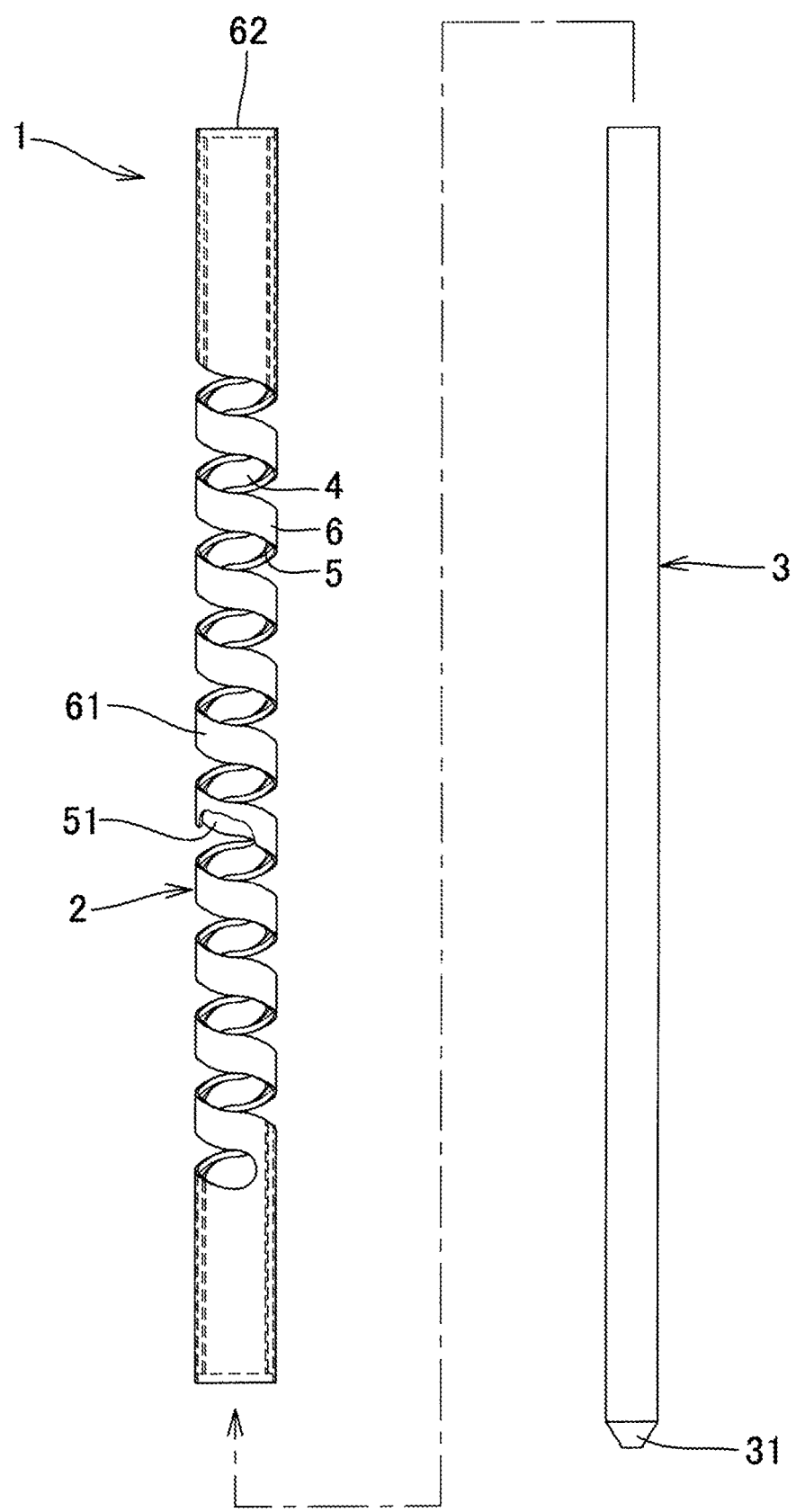
FIG. 1 is a front view illustrating an embodiment of a contact terminal using a cylindrical body according to the present disclosure.

Hereinafter, embodiments of the present disclosure will be described with reference to drawings. Note that components with the same reference numerals in the respective drawings will be the same components and description thereof will be omitted.

First Embodiment

Figure 2:
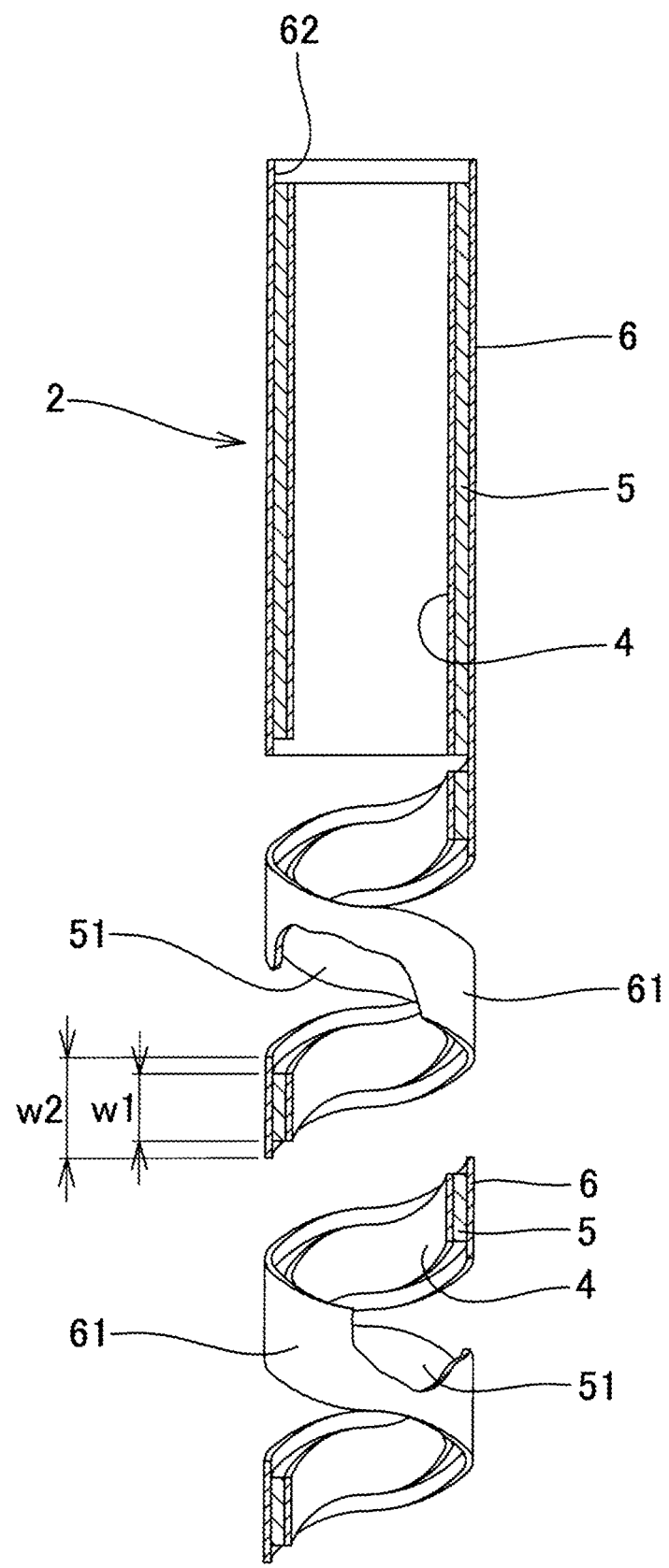
FIG. 2 is a partially cutaway front view illustrating a specific structure of the cylindrical body forming the contact terminal.

FIG. 1 is a front view illustrating an example of a contact terminal 1, and FIG. 2 is a partially cutaway front view illustrating a specific structure of a cylindrical body 2 according to the present disclosure which forms the contact terminal 1.

As illustrated in FIG. 1, the contact terminal 1 includes: the cylindrical body 2 formed in a cylindrical shape using a conductive material; and a central conductor 3 formed in a rod shape having a substantially circular cross section using a conductive material.

As illustrated in FIG. 2, the cylindrical body 2 is constituted by a gold plating layer 4 on the innermost layer, a Ni metal layer 5 made of nickel (hereinafter, referred to as Ni) or a Ni—P alloy containing Ni and a predetermined amount of phosphorus (hereinafter, referred to as P) arranged on an outer peripheral surface side of the gold plating layer 4, and a Ni—W alloy layer 6 containing a certain amount of tungsten (hereinafter referred to as W).

In a portion excluding both end portions of the cylindrical body 2, spiral spring portions 51 and 61 each of which expands and contracts in the axial direction of the cylindrical body 2 are formed in the Ni metal layer 5 and the Ni—W alloy layer 6 over predetermined lengths, respectively. In the present embodiment, a width w1 of the spring portion 51 formed in the Ni metal layer 5 is formed to be smaller than a width w2 of the spring portion 61 formed in the Ni—W alloy layer 6, as will be described later.

Further, an end portion 62 of the Ni—W alloy layer 6 protrudes outward from end surfaces of the gold plating layer 4 and the Ni metal layer 5 by a certain distance. The protrusion amount of the end portion 62 of the Ni—W alloy layer 6 is preferably 1 μm or more, and equal to or smaller than 0.5 times of an outer diameter of the cylindrical body 2.

Figure 3:
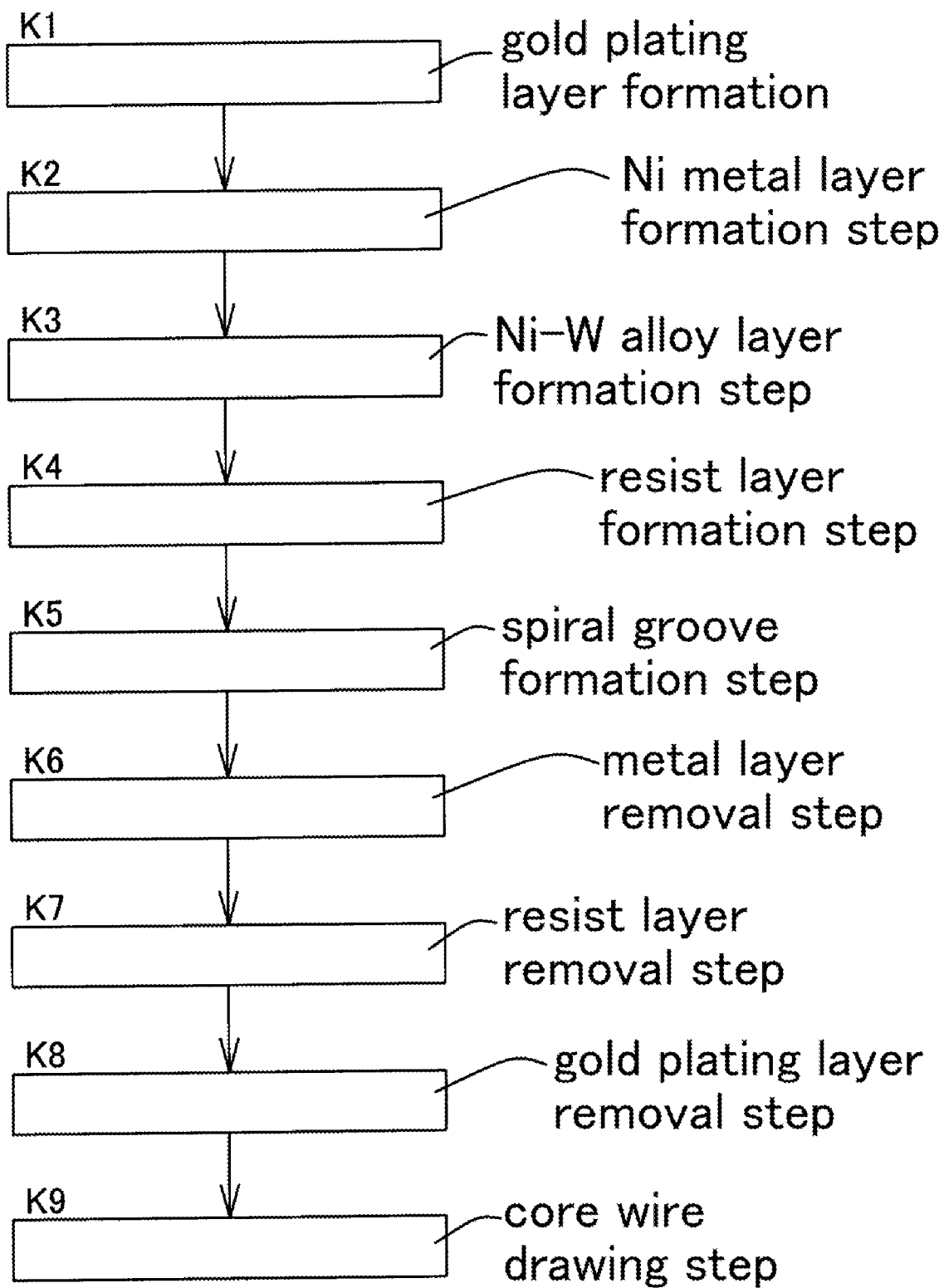
FIG. 3 is a process diagram illustrating a first embodiment of a method for producing a cylindrical body according to the present disclosure.
Figure 11:
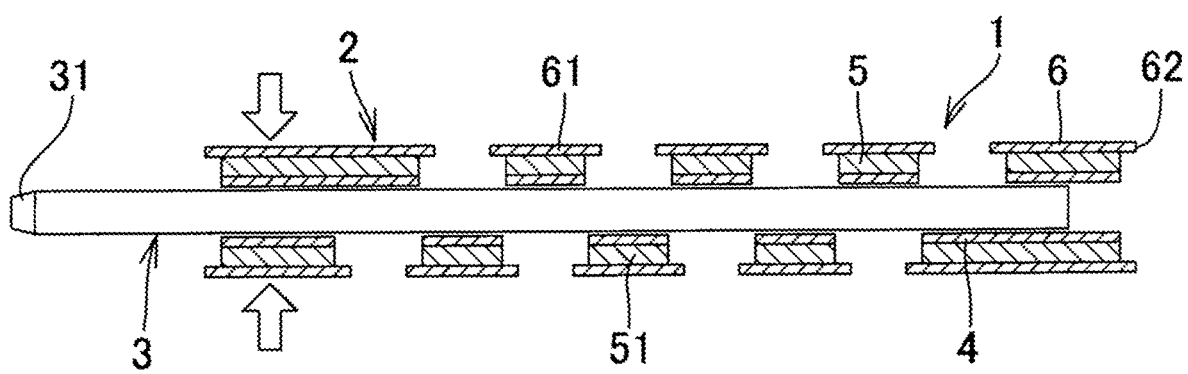
FIG. 11 is a cross-sectional view illustrating a configuration of the contact terminal including the cylindrical body and a central conductor.
Figure 12:
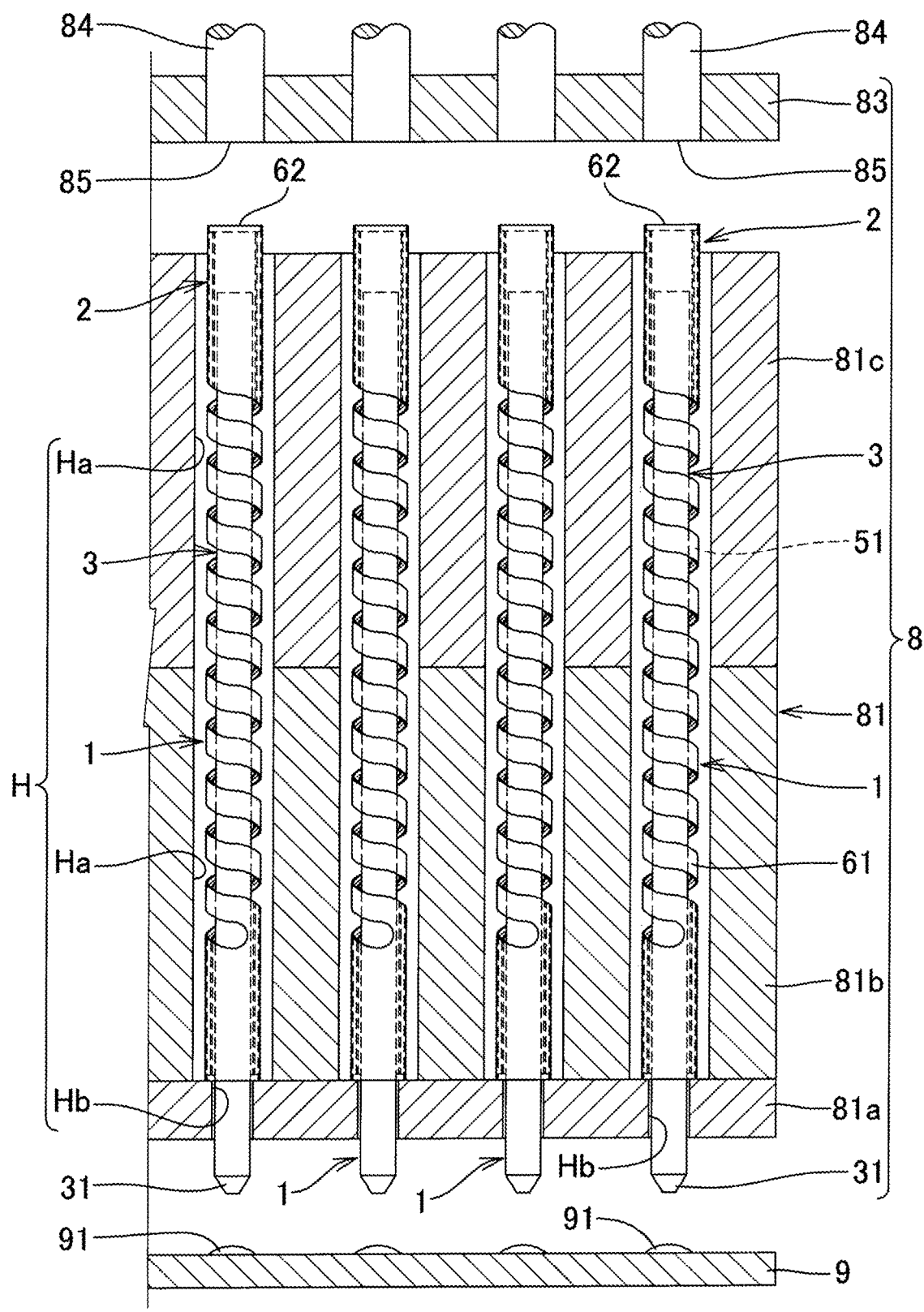
FIG. 12 is a cross-sectional view illustrating a configuration of an inspection jig including the contact terminal.
Figure 13:
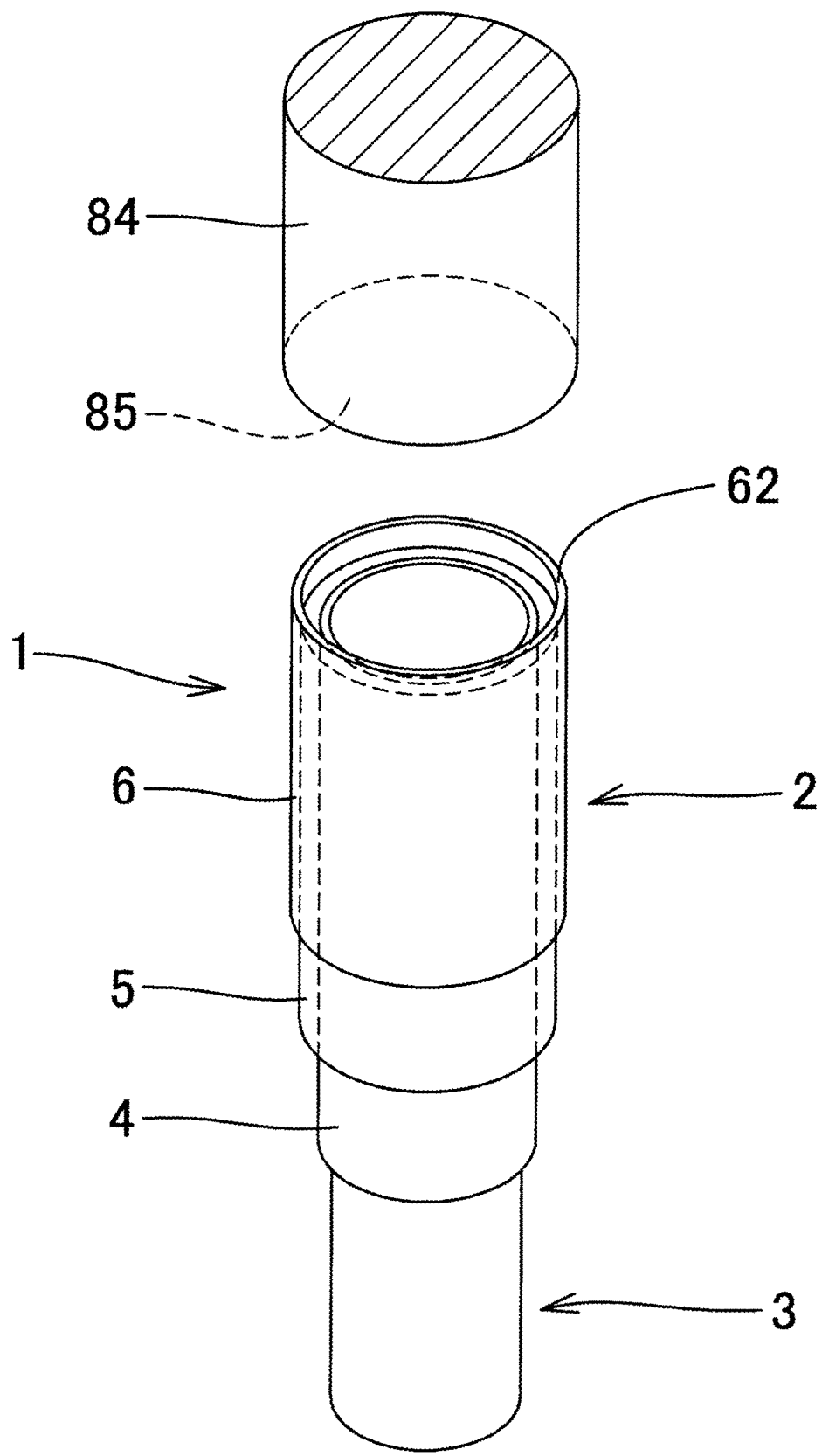
FIG. 13 is a perspective view illustrating a state where an end portion of the cylindrical body faces an electrode.
Figure 14:
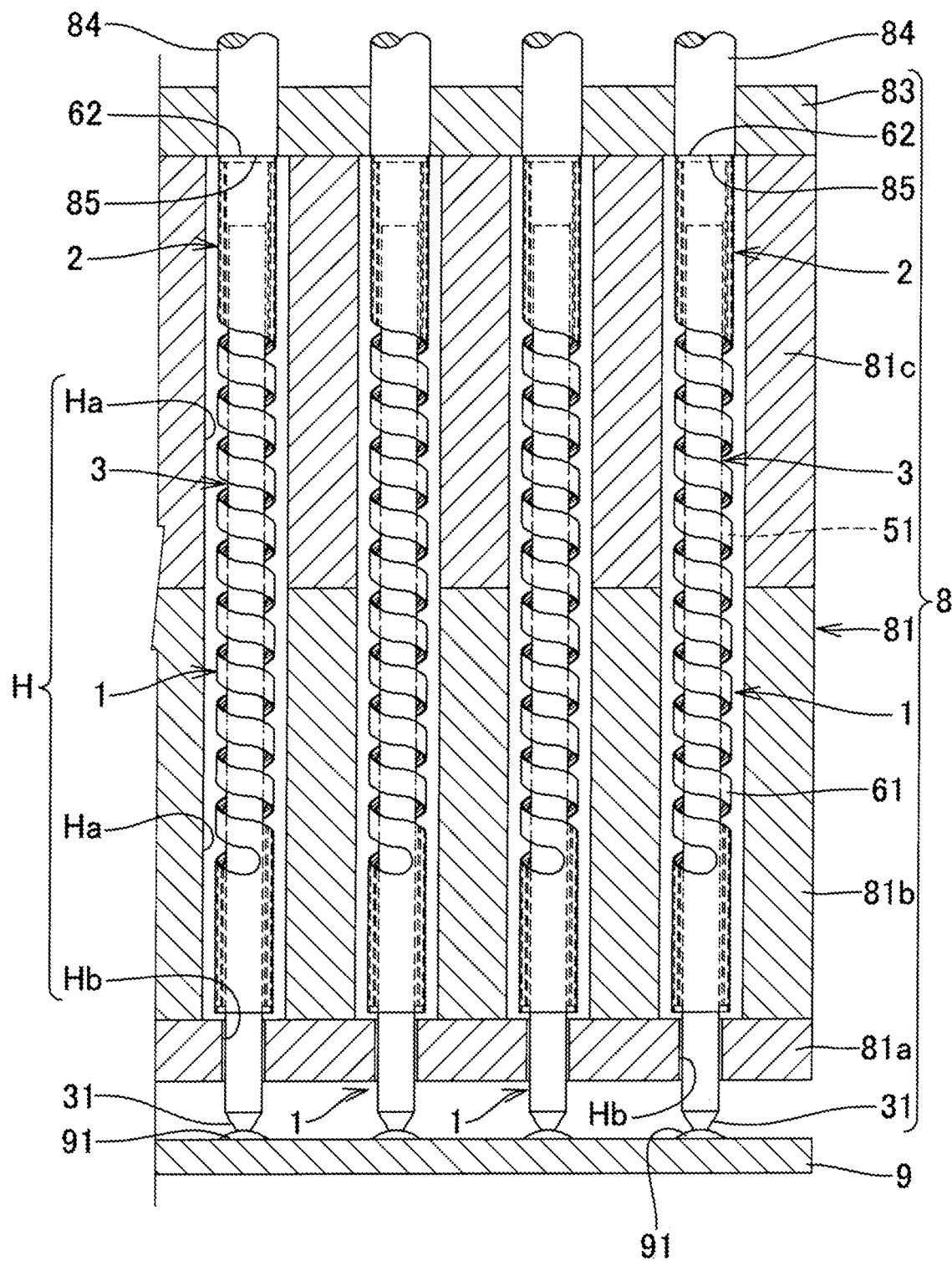
FIG. 14 is a cross-sectional view illustrating an inspection state of an inspection target.
Figure 15:
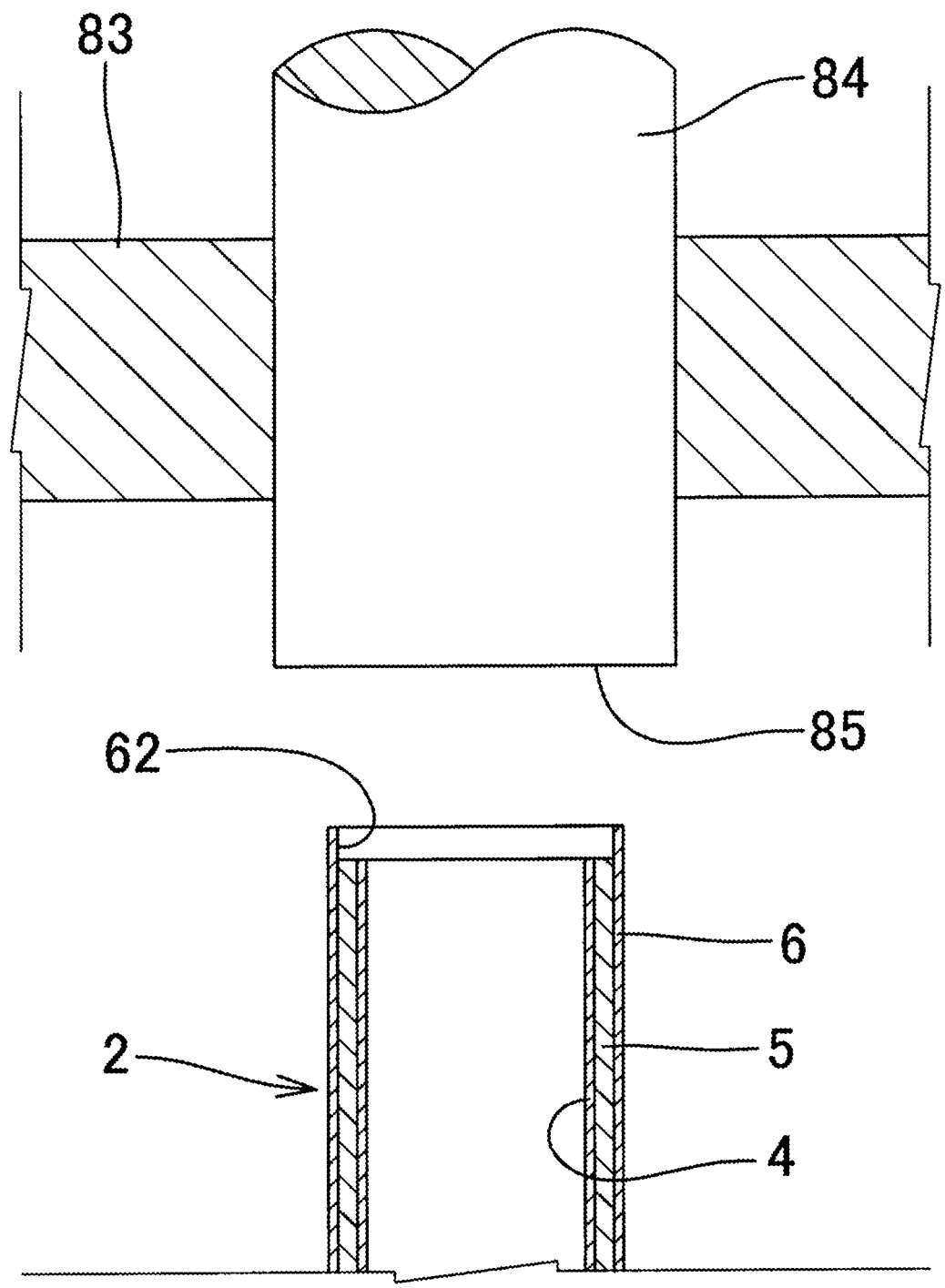
FIG. 15 is a cross-sectional view illustrating a state where the electrode protrudes from an end surface of a base plate.

FIG. 3 is a process diagram illustrating a first embodiment of a method for producing the cylindrical body 2 according to the present disclosure; FIGS. 4 to 10 are cross-sectional views illustrating first to seventh steps of a process of producing the cylindrical body 2; FIG. 11 is a cross-sectional view illustrating a configuration of the contact terminal 1 including the cylindrical body 2 and the central conductor 3; FIG. 12 is a cross-sectional view illustrating a configuration of an inspection jig 8 including the contact terminal 1; FIG. 13 is a perspective view illustrating a state where the end portion 62 of the cylindrical body 2 faces an electrode 85; FIG. 14 is a cross-sectional view illustrating an inspection state of an inspection target 9; and FIG. 15 is a cross-sectional view illustrating a state where the electrode 85 protrudes from an end surface of a base plate 83.

As illustrated in FIG. 3, the method for producing the cylindrical body 2 according to the present disclosure includes: a gold plating layer formation step K1 of forming the gold plating layer 4 on an outer peripheral surface of a core wire 10 to be described later; a Ni metal layer formation step K2 of forming the Ni metal layer 5 on an outer peripheral surface of the gold plating layer 4; a Ni—W alloy layer formation step K3 of forming the Ni—W alloy layer 6 containing W on an outer peripheral surface of the Ni metal layer 5; a resist layer formation step K4 of forming a resist layer 7 on an outer peripheral surface of the Ni—W alloy layer 6; a spiral groove formation step K5 of forming a spiral groove 71 in the resist layer 7; a metal layer removal step K6 of removing the Ni metal layer 5 and the Ni—W alloy layer 6 located in a formation portion of the spiral groove 71 by etching using the resist layer 7 as a masking material, and causing the end portion 62 of the Ni—W alloy layer 6 to protrude to the outer side of the Ni metal layer 5 depending on a difference in etching rate between the Ni metal layer 5 and the Ni—W alloy layer 6; a resist layer removal step K7 of removing the resist layer 7; a gold plating layer removal step K8 of removing the gold plating layer 4 located in the formation portion of the spiral groove 71 of the resist layer 7; and a core wire drawing step K9 of drawing the core wire 10.

Figure 4:
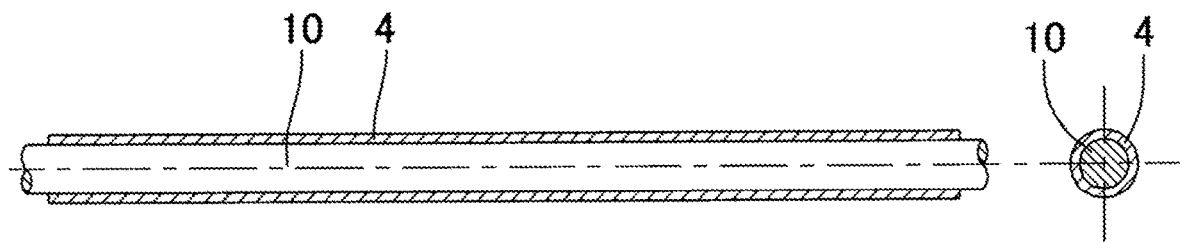
FIG. 4 is a cross-sectional view illustrating a first step in a process of producing the cylindrical body.

In the gold plating layer formation step K1, the gold plating layer 4 having a thickness of about 0.2 μm to 1 μm is formed on the surface of the core wire 10 made of steel wire, such as stainless steel and an aluminum alloy, or a wire material made of a synthetic resin, such as nylon resin and polyethylene resin, as illustrated in FIG. 4. Note that a wire having an ultrafine outer diameter of 5 μm or more, for example, about 30 μm, can be used as the core wire 10. When the wire material made of the synthetic resin is used as the core wire 10, it is preferable to form the gold plating layer 4 by electroless plating.

Figure 5:
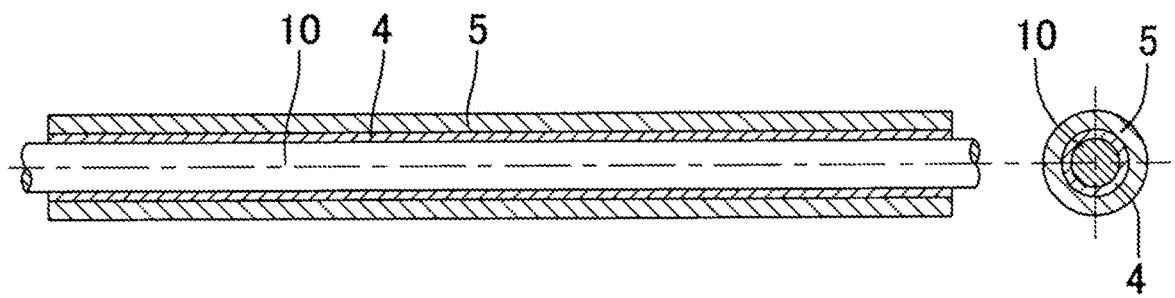
FIG. 5 is a cross-sectional view illustrating a second step in the process of producing the cylindrical body.

Next, in the Ni metal layer formation step K2, the outer peripheral surface of the gold plating layer 4 is electroformed using an electroforming apparatus (not illustrated) to form the Ni metal layer 5 made of Ni or a Ni—P alloy containing 0.5% by weight to 10% by weight of P on the outer peripheral surface of the gold plating layer 4 as illustrated in FIG. 5. The Ni metal layer 5 is set to have a thickness of about 4 μm to 15 μm.

Figure 6:
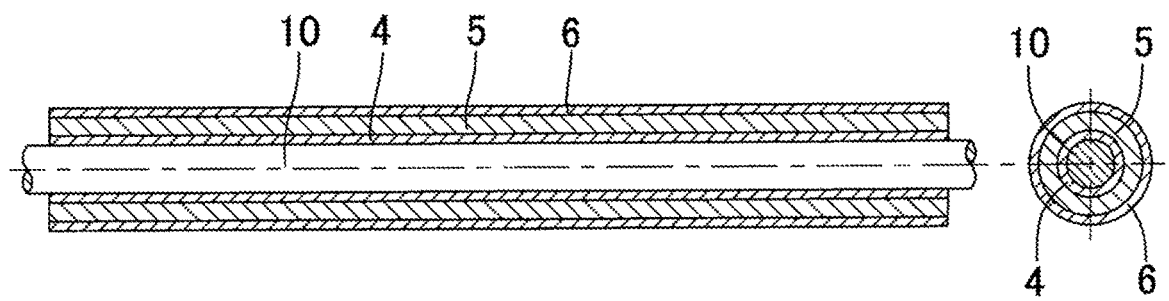
FIG. 6 is a cross-sectional view illustrating a third step of the process of producing the cylindrical body.

Further, in the Ni—W alloy layer formation step K3, the outer peripheral surface of the Ni metal layer 5 is electroformed using an electroforming apparatus (not illustrated) to form the Ni—W alloy layer 6 made of a Ni—W alloy, for example, containing 10% by weight to 90% by weight of W as illustrated in FIG. 6. The Ni—W alloy layer 6 is set to have a thickness of about 2 μm to 8 μm, and is formed to be thinner than the Ni metal layer 5.

Figure 7:
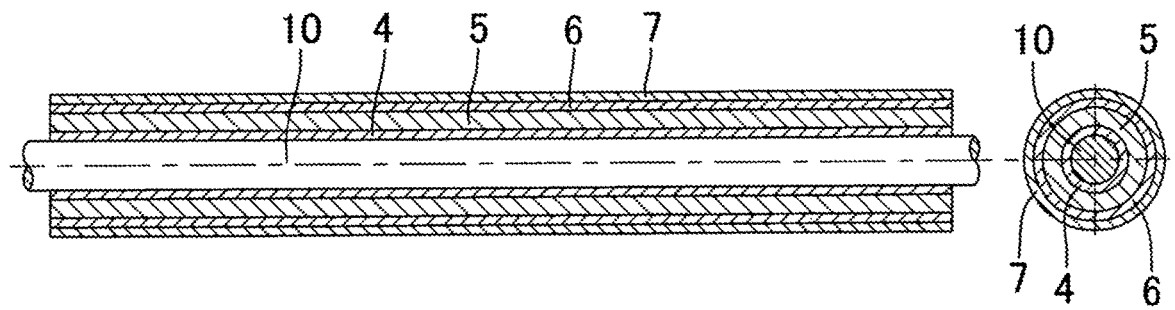
FIG. 7 is a cross-sectional view illustrating a fourth step in the process of producing the cylindrical body.

Furthermore, in the resist layer formation step K4, the core wire 10 on which the gold plating layer 4, the Ni metal layer 5 and the Ni—W alloy layer 6 have been formed is immersed in a photoresist bath containing a photoresist solution for a predetermined time. As a result, the resist layer 7 is formed on the outer peripheral surface of the Ni—W alloy layer 6 as illustrated in FIG. 7.

Figure 8:
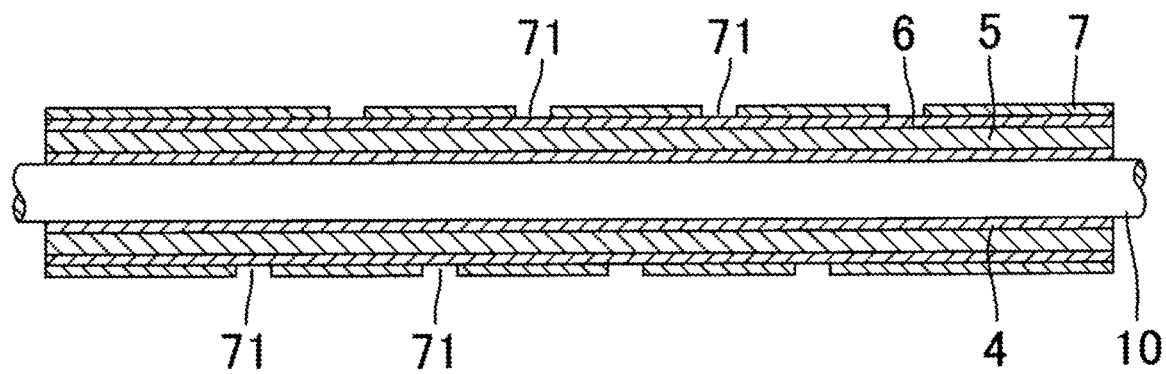
FIG. 8 is a cross-sectional view illustrating a fifth step in the process of producing the cylindrical body.

Next, in the spiral groove formation step K5, the core wire 10 is rotated at a constant speed, and the core wire 10 is irradiated with a laser beam while moving a laser irradiation apparatus (not illustrated) in the axial direction of the core wire 10, thereby forming the spiral groove 71 in the resist layer 7 as illustrated in FIG. 8.

Figure 9:
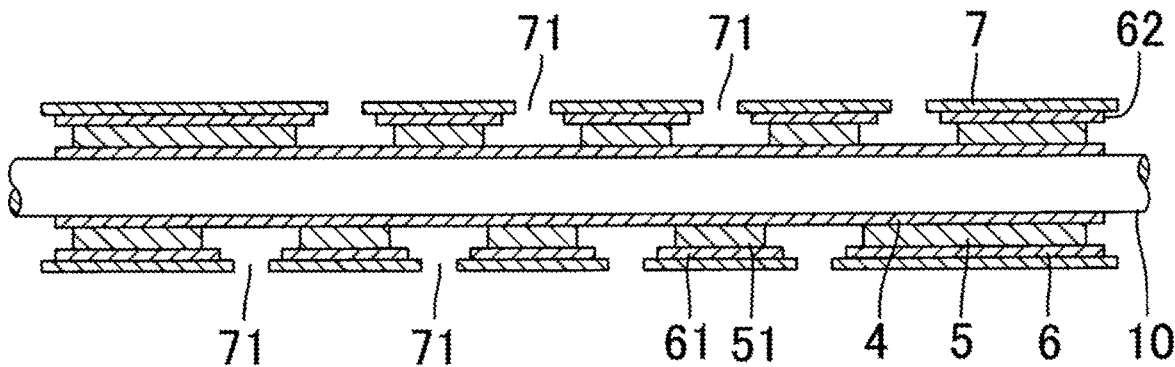
FIG. 9 is a cross-sectional view illustrating a sixth step in the process of producing the cylindrical body.
Figure 10:
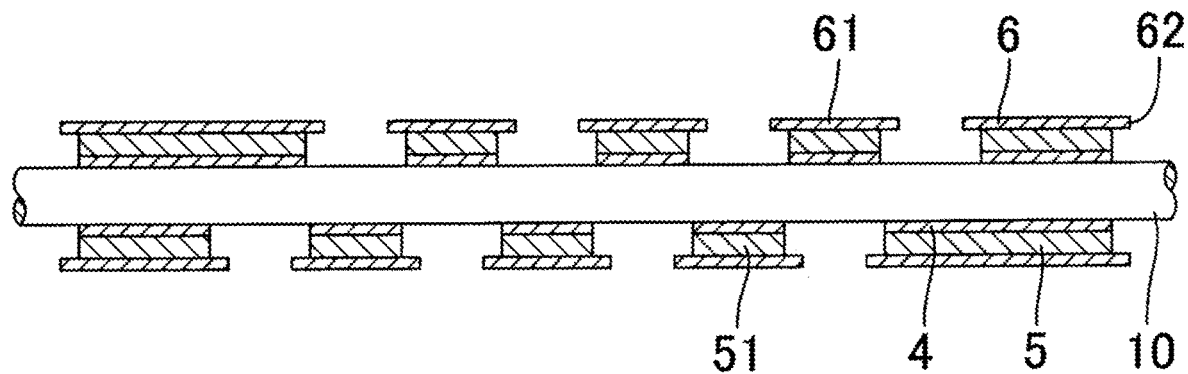
FIG. 10 is a cross-sectional view illustrating a seventh step of the process of producing the cylindrical body.

Then, in the metal layer removal step K6, the core wire 10 having the resist layer 7 formed on the outer periphery thereof is immersed in an acidic electrolytic polishing solution, and etching is performed using the resist layer 7 remaining on the outer peripheral portion of the Ni—W alloy layer 6 as a masking material to remove the Ni metal layer 5 and the Ni—W alloy layer 6 located in the formation portion of the spiral groove 71. As a result, the spring portion 51 and the spring portion 61 spirally extending along the spiral groove 71 of the resist layer 7 are formed in the Ni metal layer 5 and the Ni—W alloy layer 6, respectively, as illustrated in FIG. 9.

According to the above-described producing method, the Ni—W alloy layer 6 is disposed on the outer peripheral surface side of the Ni metal layer 5, and the end portion 62 of the Ni—W alloy layer 6 protrudes to the outer side of the Ni metal layer 5, so that the cylindrical body 2 having excellent electrical conductivity can be easily produced.

That is, the Ni—W alloy layer 6 containing a certain amount of W has more excellent corrosion resistance than the Ni metal layer 5, and thus, the etching rate of the Ni—W alloy layer 6 tends to be lower than that of the Ni metal layer 5. Therefore, even if the immersion time in the electrolytic polishing solution is the same, the end portion of the Ni metal layer 5 is eroded more than the end portion 62 of the Ni—W alloy layer 6, and accordingly, the end portion 62 of the Ni—W alloy layer 6 is turned into the state of protruding to the outer side of the Ni metal layer 5.

Further, similarly, the Ni metal layer 5 located in the formation portion of the spiral groove 71 is eroded more significantly than the Ni—W alloy layer 6, and thus, the width w1 of the spring portion 51 formed in the Ni metal layer 5 is smaller than the width w2 of the spring portion 61 formed in the Ni—W alloy layer 6 (see FIG. 2).

Next, in the resist layer removal step K7, the resist layer 7 is dissolved and removed using a resist layer removing solution or the like. In the gold plating layer removal step K8, the gold plating layer 4 located in the formation portion of the spiral groove 71 is removed by an ultrasonic cleaning method or the like (see FIG. 10).

In the core wire drawing step K9, the core wire 10 is pulled to reduce its outer diameter, so that the core wire 10 is peeled off from the gold plating layer 4 and drawn. As a result, the cylindrical body 2 having the Ni metal layer 5 with the gold plating layer 4 provided on the inner peripheral surface and the Ni—W alloy layer 6 provided on the outer peripheral surface side of the Ni metal layer 5 is produced as illustrated in FIG. 2.

Meanwhile, the central conductor 3 is formed of a rod-shaped body having a circular cross section and having an outer diameter that can be inserted into the cylindrical body 2, and a tapered connection portion 31 is formed at one end portion of the central conductor 3. Then, the cylindrical body 2 and the central conductor 3 are integrally connected by caulking, welding, press-fitting, or other methods in a state where a body portion of the central conductor 3 is inserted into the cylindrical body 2 and a distal end portion of the central conductor 3 including the connection portion 31 protrudes outward from the cylindrical body 2 by a predetermined distance, whereby the contact terminal 1 having the cylindrical body 2 and the central conductor 3 is produced as illustrated in FIG. 11.

The contact terminal 1 produced as described above is supported by a support member 81 and the base plate 83 which form the inspection jig 8 as illustrated in FIG. 12. The inspection jig 8 is used for inspection of the inspection target 9 including, for example, a glass epoxy substrate, a flexible substrate, a ceramic multilayer wiring board, an electrode plate for a liquid crystal display or a plasma display, a transparent conductive plate for a touch panel, and a package substrate or a film carrier for a semiconductor package, or a semiconductor substrate such as a semiconductor wafer and a semiconductor element.

The support member 81 is configured by, for example, laminating plate-shaped support plates 81a, 81b, and 81c. In addition, a plurality of through holes H are formed to pass through the support plates 81a, 81b, and 81c, respectively.

The support plate 81b and the support plate 81c respectively include insertion hole portions Ha each of which is defined by an opening hole having a predetermined diameter. Further, in the support plate 81a, a small-diameter portion Hb, formed using a through hole having a smaller diameter smaller than an insertion hole portion Ha, is formed at a portion facing a point 91 to be inspected of a substrate or the like which is the inspection target 9. The small-diameter portion Hb of the support plate 81a communicates with the insertion hole portions Ha of the support plate 81b and the support plate 81c to form a through hole H that is an installation portion of the contact terminal 1.

Note that the support member 81 may be configured such that the through hole H including the small-diameter portion Hb and the insertion hole portion Ha is provided in an integrated member without being limited to the configuration in which the plate-shaped support plates 81a, 81b, and 81 are laminated. Further, the support plate 81b and the support plate 81c may be arranged apart from each other and connected by, for example, a support or the like, instead of the example in which the support plates 81b and 81c of the support member 81 are laminated on each other.

The base plate 83 made of, for example, an insulating resin material is provided on one end side of the support plate 81c. The base plate 83 blocks an opening of the through hole H, that is, an end surface of the insertion hole portion Ha. Wires 84 are attached to the base plate 83 so as to pass through the base plate 83 at positions opposite to the through holes H. Then, the electrode 85 formed of the end surface of the wires 84 is arranged so as to face the cylindrical body 2 of the contact terminal 1 as illustrated in FIG. 13.

During the inspection of the inspection target 9 including a substrate or the like, one end portion of the contact terminal 1 supported by the support member 81, specifically, the end portion 62 of the Ni—W alloy layer 6 forming the cylindrical body 2 abuts on the electrode 85 provided on the base plate 83 as illustrated in FIG. 14. Further, the other end portion of the contact terminal 1, specifically, the connection portion 31 of the central conductor 3 abuts on the point 91 to be inspected, such as a wiring pattern and a solder bump, provided on the inspection target 9.

Then, the spring portions of the cylindrical body 2, specifically, the spring portion 11 of the Ni metal layer 5 and the spring portion 61 of the Ni—W alloy layer 6 are compressed and elastically deformed in response to the pressure applied to the contact terminal 1. As a result, one end portion of the cylindrical body 2 is pressed against the electrode 85 in response to a restoring force of the cylindrical body 2, and the proximal end portion of the contact terminal 1 and the electrode 85 are conductively connected. Further, the connection portion 31 of the central conductor 3 is elastically pressed against the point 91 to be inspected so that the distal end portion of the contact terminal 1 and the point 91 to be inspected are conductively connected.

In this manner, the contact terminal 1 is installed to include the cylindrical body 2 made of the conductive member provided with the spiral spring portions 51 and 61, the cylindrical body 2 has the Ni metal layer 5 and the Ni—W alloy layer 6 containing W, and the end portion 62 of the Ni—W alloy layer 6 protrudes to the outer side of the Ni metal layer 5, and thus, has an advantage that excellent electrical conductivity can be obtained with a simple configuration.

That is, as compared with a case where both the Ni metal layer 5 and the Ni—W alloy layer 6 forming the cylindrical body 2 are brought into contact with the electrode 85, the contact area between the cylindrical body 2 and the electrode 85 is significantly reduced, so that the contact pressure therebetween can be sufficiently increased. Moreover, the Ni—W alloy layer 6 containing a certain amount of W has a characteristic that the hardness is remarkably higher than that of the Ni metal layer 5 or the like. Thus, when a natural oxide film is formed on the surface of the electrode 85, the reliability of breaking through the natural oxide film and conductively connecting the contact terminal 1 and the electrode 85 increases.

Therefore, it is easy to properly inspect the inspection target 9 in the state where the contact terminal 1 and the electrode 85 are conductively connected without performing gold plating on the electrode 85 to suppress the formation of the natural oxide film or regularly removing the natural oxide film formed on the surface of the electrode 85 as in the related art.

For example, when the content of W in the Ni—W alloy layer 6 is set to 10% by weight or more, the hardness of the Ni—W alloy layer 6 can be effectively enhanced. Further, when the content of W in the Ni—W alloy layer 6 is set to less than 90% by weight, the strength of the Ni—W alloy layer 6 can be sufficiently maintained.

When the content of tungsten is high, a resistance value of the Ni—W alloy layer 6 becomes high, and thus, the content of W in the Ni—W alloy layer 6 is more desirably 10 to 70% by weight. Further, a difference in etching amount between Ni or the Ni alloy and Ni—W increases as the content of tungsten increases, and thus, the content of W in the Ni—W alloy layer 6 is more desirably 30 to 70% by weight.

The content of W in the Ni—W alloy layer 6 is measured by energy dispersive X-ray analysis (EDX) on the surface of the Ni—W alloy layer 6. In this measuring method, a plurality of predetermined points are set in the Ni—W alloy layer 6, and the average of values measured at the plurality of points is calculated. The predetermined points are not particularly limited, and may be set to, for example, points at regular intervals along the length of the Ni—W alloy layer 6. Further, one or more points can be set respectively from the spring portion 61 and two cylindrical portions formed so as to sandwich the spring portion 61 as illustrated in FIG. 1. Specifically, the surface is measured by EDX in a state where the Ni—W alloy layer 6 is exposed. In a contact terminal 1a of FIG. 17 to be described later, it is sufficient to measure a surface of an exposed portion of a Ni—W alloy layer 6a near an end portion 62a, or a surface of the Ni—W alloy layer 6a exposed by peeling off a Ni metal layer 5a. Before the measurement, a surface of an object is washed with ethanol. An apparatus that has an SEM and EDX integrated therein, for example, may be used for the measurement. An electron beam of 15 kV and 80 μA may be used. The content of W is calculated as an average of values obtained by measuring five points along the length direction (pipe axial direction).

Further, according to the configuration in which the Ni—W alloy layer 6 is arranged on the outer peripheral surface side of the Ni metal layer 5 as illustrated in the first embodiment described above, the strength and elasticity of the cylindrical body 2 can be sufficiently maintained by effectively reinforcing the Ni—W alloy layer 6 provided with the end portion 62 that abuts on the electrode 85 by the Ni metal layer 5 arranged on the inner surface side thereof.

Moreover, the Ni metal layer 5 has higher conductivity than the Ni—W alloy layer 6, and thus, most of the current passing through the contact terminal 1 flows through the Ni metal layer 5, except for the end portion of the cylindrical body 2. Therefore, the cylindrical body 2 has a multi-layer structure including the Ni metal layer 5 and the Ni—W alloy layer 6, and thus, there is an advantage that an increase in electric resistance of the contact terminal 1 can be effectively suppressed. In particular, when the thickness of the Ni—W alloy layer 6 is formed to be thinner than the Ni metal layer 5 as illustrated in the above embodiment, the increase in electric resistance of the contact terminal 1 can be more effectively suppressed.

Furthermore, when the electrode 85 formed of the end surface of the wire 84 protrudes from the end surface of the base plate 83 as illustrated in FIG. 15 or when the electrode 85 and the end surface of the base plate 83 are formed to be flush with each other, a contact range between the end portion 62 of the Ni—W alloy layer 6 and the electrode 85 can be set in a wide range by adopting the configuration in which the Ni—W alloy layer 6 is disposed on the outer peripheral surface side of the Ni metal layer 5. As a result, there is an advantage that it is possible to effectively suppress the formation of dents on the electrode 85 while maintaining good electrical conductivity between the cylindrical body 2 and the electrode 85.

Note that the Ni metal layer 5 made of the Ni—P alloy containing 0.5% by weight to 10% by weight of P has a characteristic that plastic deformation hardly occurs even at a high temperature of 150° C. or higher. For this reason, when the Ni metal layer 5 is formed using the Ni—P alloy containing 0.5% by weight to 10% by weight of P, the strength and elasticity of the cylindrical body 2 can be further improved.

Further, when the protrusion amount of the end portion 62 of the Ni—W alloy layer 6 is set to 1 μm or more as described above, it is possible to prevent the Ni metal layer 5 from coming into contact with the electrode 85 and to bring the end portion 62 of the Ni—W alloy layer 6 into contact with the electrode 85. Moreover, when the protrusion amount of the end portion 62 of the Ni—W alloy layer 6 is set equal to or smaller than 0.5 times of the outer diameter of the cylindrical body 2 as described above, it is possible to reduce the increase in electrical resistance of the cylindrical body 2, and further, there is an advantage that the possibility of breakage of the end portion 62 of the Ni—W alloy layer 6 can be reduced when the end portion 62 of the Ni—W alloy layer 6 is brought into contact with the electrode 85.

Note that, in the method for producing the cylindrical body illustrated in FIG. 3, the gold plating layer formation step K1 and the gold plating layer removal step K8 may be omitted to obtain a structure in which the Ni metal layer 5 is formed on the outer peripheral surface of the core wire 10 by electroforming, and the gold plating layer 4 located on the inner peripheral surface of the Ni metal layer 5 is omitted.

Second Embodiment

Figure 16:
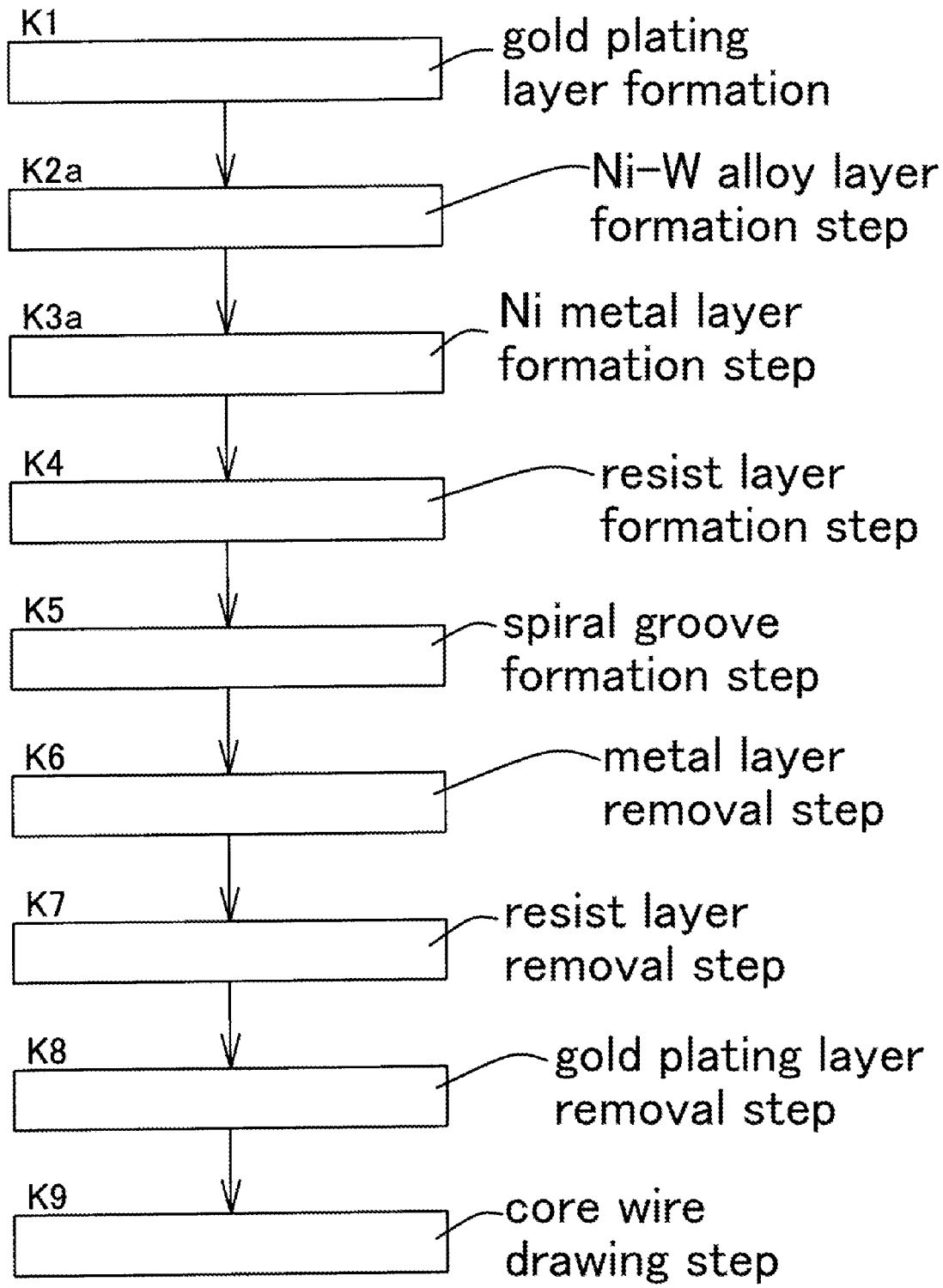
FIG. 16 is a process diagram illustrating a second embodiment of the method for producing a cylindrical body according to the present disclosure.
Figure 17:
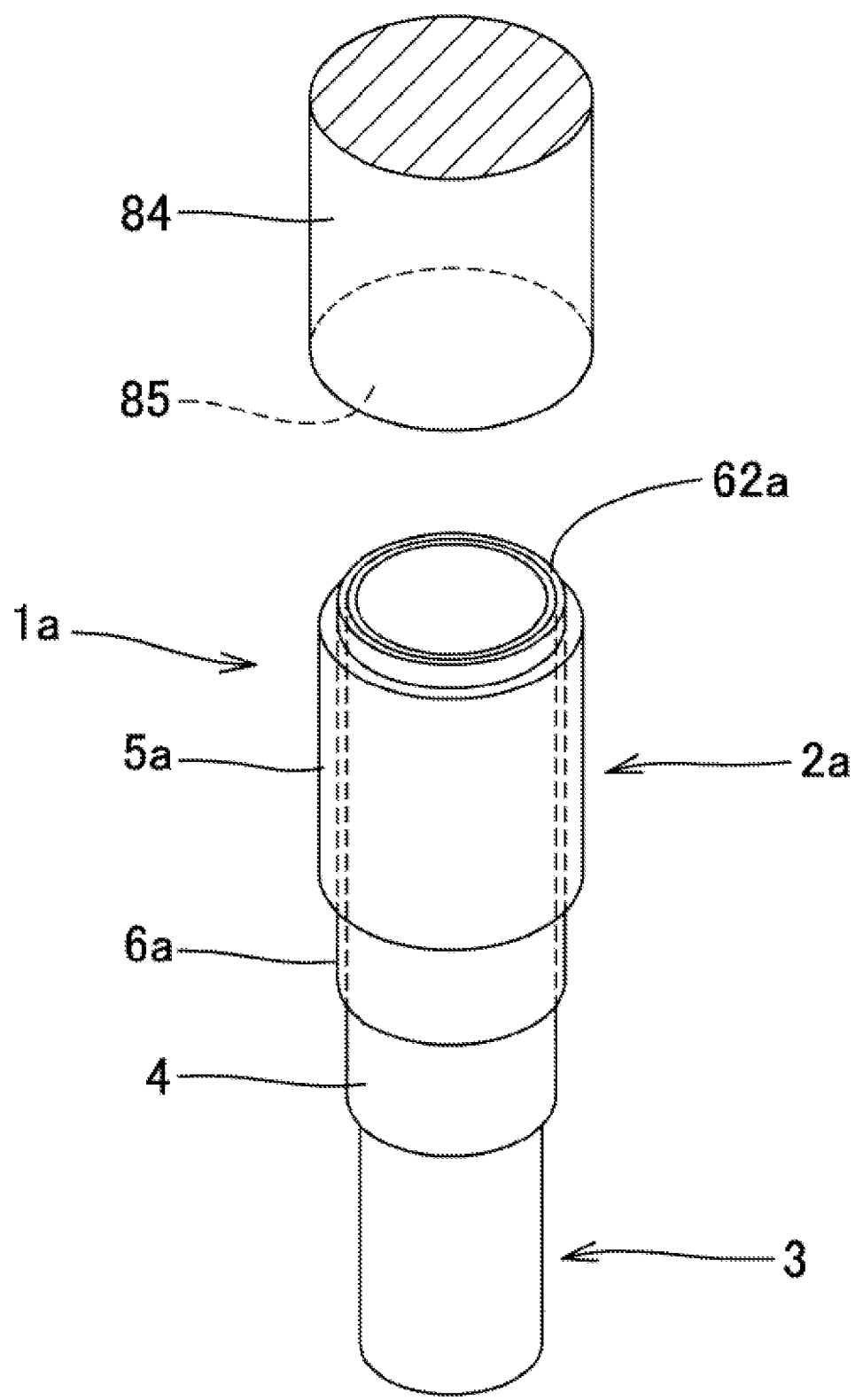
FIG. 17 is a perspective view illustrating a state where an end portion of the cylindrical body according to the second embodiment of the present disclosure faces an electrode.
Figure 18:
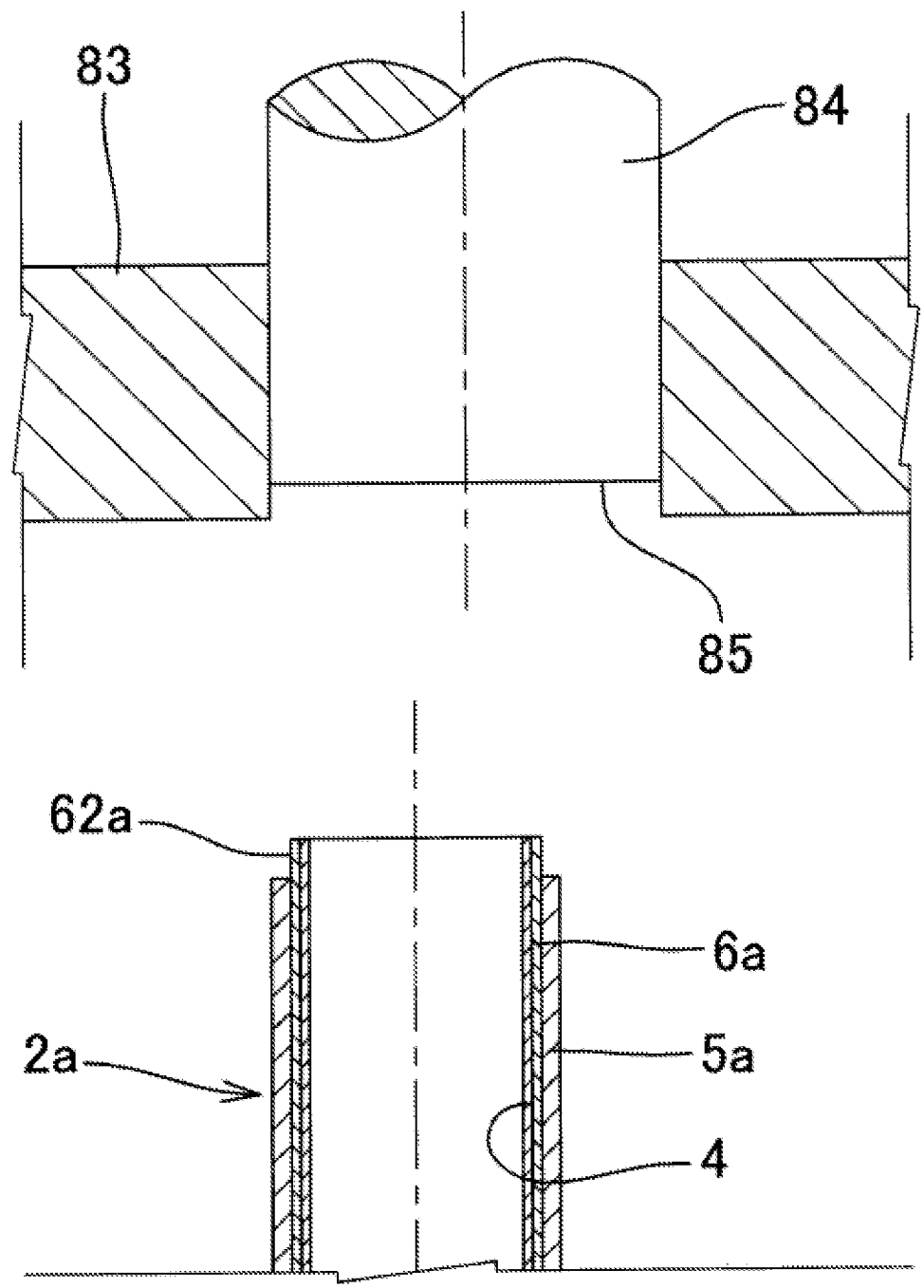
FIG. 18 is a cross-sectional view illustrating a state where the electrode is recessed to the inner side of an end surface of a base plate.

FIG. 16 is a process diagram illustrating a method for producing a cylindrical body according to a second embodiment of the present disclosure; FIG. 17 is a perspective view illustrating a configuration of a contact terminal 1a using a cylindrical body 2a according to the second embodiment of the present disclosure; and FIG. 18 is a cross-sectional view illustrating a state where the electrode 85 is recessed inward from an end surface of the base plate 83.

The method for producing a cylindrical body according to the second embodiment is provided with: the gold plating layer formation step K1 of forming the gold plating layer 4 on an outer peripheral surface of a core wire; a Ni—W alloy layer formation step K2a of forming a Ni—W alloy layer 6a containing W on an outer periphery of the gold plating layer 4; a Ni metal layer formation step K3a of forming a Ni metal layer 5a on an outer peripheral surface of the Ni—W alloy layer 6a; a resist layer formation step K4 of forming a resist layer on an outer peripheral surface of the Ni metal layer 5a; a spiral groove formation step K5 of forming a spiral groove in this resist layer; a metal layer removal step K6 of removing the Ni metal layer 5a and the Ni—W alloy layer 6a located in a formation portion of the spiral groove by etching using the resist layer as a masking material, and causing an end portion of the Ni—W alloy layer 6a to protrude to the outer side of the Ni metal layer 5a depending on a difference in etching rate between the Ni metal layer 5 and the Ni—W alloy layer 6; a resist layer removal step K7 of removing the resist layer 7; the gold plating layer removal step K8 of removing the gold plating layer 4 located in the formation portion of the spiral groove; and the core wire drawing step K9 of drawing the core wire.

According to the method for producing a cylindrical body according to the second embodiment, the cylindrical body 2a is produced in which the Ni—W alloy layer 6a is formed on the outer peripheral surface of the gold plating layer 4 formed in the gold plating layer formation step K1 and the Ni metal layer 5a is formed on the outer peripheral surface of the Ni—W alloy layer 6a as illustrated in FIG. 17. The Ni—W alloy layer 6a is arranged on the inner peripheral surface side of the Ni metal layer 5a in the cylindrical body 2a, which is different from the above first embodiment in which the Ni—W alloy layer 6 is arranged on the outer peripheral surface side of the Ni metal layer 5.

When the Ni—W alloy layer 6a is arranged on the inner peripheral surface side of the Ni metal layer 5a in this manner, the end portion 62a of the Ni—W alloy layer 6a is located closer to an axial center of the cylindrical body 2a as compared with the cylindrical body 2 according to the first embodiment. For this reason, there is an advantage that the end portion 62a of the Ni—W alloy layer 6a and the electrode 85 can be easily aligned with each other.

For example, when the electrode 85 is recessed inward from the end surface of the base plate 83 as illustrated in FIG. 18, there is a possibility that the Ni—W alloy layer 6a abuts on the end surface of the base plate 83 so that it is difficult to bring the electrode 85 and the Ni—W alloy layer 6a into contact with each other if a significant misalignment occurs between an axial center of the cylindrical body 2 and an axial center of the electrode 85. However, when the Ni—W alloy layer 6a is located on the inner side of the cylindrical body 2a as in the second embodiment, it is possible to prevent the Ni—W alloy layer 6a from abutting on the end surface of the base plate 83 as much as possible as compared with the case where the Ni—W alloy layer 6 is positioned on the outer side of the cylindrical body 2 as in the first embodiment. Therefore, the alignment for contact between the electrode 85 and the Ni—W alloy layer 6a is easily performed by disposing the Ni—W alloy layer 6a on the inner peripheral surface side of the Ni metal layer 5a as described above.

Note that, in the method for producing the contact terminal illustrated in FIG. 16, the gold plating layer formation step K1 and the gold plating layer removal step K8 may be omitted to obtain a structure in which the Ni—W alloy layer 6a is formed on the outer peripheral surface of the core wire by electroforming, and the gold plating layer 4 located on the inner peripheral surface of the Ni—W alloy layer 6a is omitted.

Further, the cylindrical bodies 2 and 2a can be used for various applications without being limited to the example used as a constituent member of the contact terminal. Further, the cylindrical bodies 2 and 2a may be used directly as the contact terminals without being limited to the example in which the cylindrical bodies 2 and 2a are combined with the central conductor 3.

That is, a cylindrical body according to an example of the present disclosure is a cylindrical body formed of a conductive member provided with a spiral spring portion. The cylindrical body includes a Ni metal layer and a Ni—W alloy layer containing W, and an end portion of the Ni—W alloy layer protrudes to an outer side of the Ni metal layer.

According to this configuration, the contact area between the cylindrical body and the electrode is significantly reduced, so that the contact pressure between the two can be sufficiently enhanced. Moreover, the Ni—W alloy layer containing a certain amount of W has a characteristic that the hardness is remarkably higher than that of the Ni metal layer or the like made of Ni or a Ni—P alloy. Thus, even when a natural oxide film is formed on the surface of the electrode, it is easy to break through the natural oxide film and conductively connect the cylindrical body and the electrode.

Further, it is preferable that the Ni—W alloy layer be disposed on the outer peripheral surface side of the Ni metal layer.

According to this configuration, the Ni—W alloy layer provided with the end portion that abuts on the electrode can be effectively reinforced by the Ni metal layer having low electric resistance. Therefore, it is possible to sufficiently maintain the strength and elasticity of the cylindrical body while maintaining the good conductivity of the cylindrical body.

Further, the Ni—W alloy layer may be disposed on the inner peripheral surface side of the Ni metal layer.

According to this configuration, the end portion of the Ni—W alloy layer is located close to the axial center of the cylindrical body, and thus, there is an advantage that the end portion of the Ni—W alloy layer and the electrode can be easily aligned with each other even when the electrode is recessed in the base plate.

Further, a method for producing a cylindrical body according to an example of the present disclosure includes: a gold plating layer formation step of forming a gold plating layer on an outer peripheral surface of a core wire; a Ni metal layer formation step of forming a Ni metal layer on an outer peripheral surface of the gold plating layer; a Ni—W alloy layer formation step of forming a Ni—W alloy layer containing W on an outer peripheral surface of the Ni metal layer; a resist layer formation step of forming a resist layer on an outer peripheral surface of the Ni—W alloy layer; a spiral groove formation step of forming a spiral groove in the resist layer; a metal layer removal step of removing the Ni metal layer and the Ni—W alloy layer located in a formation portion of the spiral groove by etching using the resist layer as a masking material and eroding an end portion of the Ni metal layer such that an end portion of the Ni—W alloy layer protrudes to an outer side of the Ni metal layer depending on a difference in etching rate between the Ni metal layer and the Ni—W alloy layer; a resist layer removal step of removing the resist layer; a gold plating layer removal step of removing the gold plating layer located in the formation portion of the spiral groove; and a core wire drawing step of drawing the core wire.

According to this configuration, the cylindrical body in which the Ni—W alloy layer is disposed on the outer peripheral surface side of the Ni metal layer and the end portion of the Ni—W alloy layer protrudes to the outer side of the Ni metal layer is provided, so that the cylindrical body having excellent electrical conductivity can be easily produced.

Further, a method for producing a cylindrical body according to an example of the present disclosure includes: a gold plating layer formation step of forming a gold plating layer on an outer peripheral surface of a core wire; a Ni—W alloy layer formation step of forming a Ni—W alloy layer containing W on an outer peripheral surface of the gold plating layer; a Ni metal layer formation step of forming a Ni metal layer on an outer peripheral surface of the Ni—W alloy layer; a resist layer formation step of forming a resist layer on an outer peripheral surface of the Ni metal layer; a spiral groove formation step of forming a spiral groove in the resist layer; a metal layer removal step of removing the Ni metal layer and the Ni—W alloy layer located in a formation portion of the spiral groove by etching using the resist layer as a masking material and eroding an end portion of the Ni metal layer such that an end portion of the Ni—W alloy layer protrudes to an outer side of the Ni metal layer depending on a difference in etching rate between the Ni metal layer and the Ni—W alloy layer; a resist layer removal step of removing the resist layer; a gold plating layer removal step of removing the gold plating layer located in the formation portion of the spiral groove; and a core wire drawing step of drawing the core wire.

According to this configuration, the cylindrical body in which the Ni—W alloy layer is disposed on the inner peripheral surface side of the Ni metal layer and the end portion of the Ni—W alloy layer protrudes to the outer side of the Ni metal layer is provided, so that it is possible to easily produce the cylindrical body in which the end portion of the Ni—W alloy layer and the electrode can be easily aligned.

The cylindrical body having such a configuration can easily obtain excellent electrical conductivity with a simple configuration. Further, according to the above-described method for producing the cylindrical body, the cylindrical body having excellent electrical conductivity can be easily produced.

This application is based on Japanese Patent Application No. 2018-086082 filed on Apr. 27, 2018, the content of which is included in the present application. Note that the specific embodiments or examples described in the section of the detailed description are intended to clarify the technical contents of the present disclosure, and the present disclosure should not be narrowly interpreted as being limited only to such specific examples.

Features of the above-described preferred embodiments and the modifications thereof may be combined appropriately as long as no conflict arises.

While preferred embodiments of the present disclosure have been described above, it is to be understood that variations and modifications will be apparent to those skilled in the art without departing from the scope and spirit of the present disclosure. The scope of the present disclosure, therefore, is to be determined solely by the following claims.

What is claimed is:

1. A cylindrical body formed of a conductive member provided having a spiral spring portion, the cylindrical body comprising a Ni metal layer and a Ni—W alloy layer containing W at least on an end portion of the cylindrical body,
wherein at the end portion the Ni—W alloy layer protrudes outward from an end surface of the Ni metal layer by a distance of 1 µm or more of the cylindrical body.

2. The cylindrical body according to claim 1, wherein the Ni—W alloy layer is disposed on an outer peripheral surface side of the Ni metal layer.

3. The cylindrical body according to claim 1, wherein the Ni—W alloy layer is disposed on an inner peripheral surface side of the Ni metal layer.

4. A method for producing a cylindrical body comprising:
forming a gold plating layer on an outer peripheral surface of a core wire;
forming a Ni metal layer on an outer peripheral surface of the gold plating layer;
forming a Ni—W alloy layer containing W on an outer peripheral surface of the Ni metal layer;
forming a resist layer on an outer peripheral surface of the Ni—W alloy layer;
forming a spiral groove in the resist layer;
removing the Ni metal layer and the Ni—W alloy layer located in a formation portion of the spiral groove by etching using the resist layer as a masking material and eroding an end portion of the Ni metal layer such that an end portion of the Ni—W alloy layer protrudes outward from an end surface to an outer side of the Ni metal layer by a distance of 1 µm or more of the cylindrical body, depending on a difference in etching rate between the Ni metal layer and the Ni—W alloy layer;
removing the resist layer;
removing the gold plating layer located in the formation portion of the spiral groove; and
drawing the core wire.

5. A method for producing a cylindrical body comprising:
forming a gold plating layer on an outer peripheral surface of a core wire;
forming a Ni—W alloy layer containing W on an outer peripheral surface of the gold plating layer;
forming a Ni metal layer on an outer peripheral surface of the Ni—W alloy layer;
forming a resist layer on an outer peripheral surface of the Ni metal layer;
forming a spiral groove in the resist layer;
removing the Ni metal layer and the Ni—W alloy layer located in a formation portion of the spiral groove by etching using the resist layer as a masking material and eroding an end portion of the Ni metal layer such that an end portion of the Ni—W alloy layer protrudes outward from an end surface of the Ni metal layer by a distance of 1 µm or more of the cylindrical body, depending on a difference in etching rate between the Ni metal layer and the Ni—W alloy layer;
removing the resist layer;
removing the gold plating layer located in the formation portion of the spiral groove; and
drawing the core wire.

6. The cylindrical body according to claim 1, wherein the Ni—W alloy layer protrudes outward from the end surface of the Ni metal layer at least by a distance equal to or smaller than 0.5 times of an outer diameter of the cylindrical body.

7. The method according to claim 4, wherein the Ni—W alloy layer also protrudes outward from the end surface of the gold plating layer.

8. The method according to claim 5, wherein the Ni—W alloy layer also protrudes outward from the end surface of the gold plating layer.

* * * * *